United States Patent
Hurley

(10) Patent No.: US 8,265,103 B2
(45) Date of Patent: Sep. 11, 2012

(54) APPARATUS AND METHOD FOR FLEXIBLE VISIBILITY IN INTEGRATED CIRCUITS WITH MINIMAL PACKAGE IMPACT

(75) Inventor: William M. Hurley, Murphy, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 1625 days.

(21) Appl. No.: 11/622,879

(22) Filed: Jan. 12, 2007

(65) Prior Publication Data
US 2008/0170506 A1 Jul. 17, 2008

(51) Int. Cl.
*H04J 3/00* (2006.01)
*G06F 11/00* (2006.01)
*G06F 13/14* (2006.01)
*G01R 31/28* (2006.01)
*G01L 15/00* (2006.01)

(52) U.S. Cl. .......... 370/535; 714/30; 714/726; 710/305; 702/120

(58) Field of Classification Search .................. 370/535; 714/30, 726; 710/305; 702/120
See application file for complete search history.

(56) References Cited

U.S. PATENT DOCUMENTS

| | | | | |
|---|---|---|---|---|
| 5,675,749 A * | 10/1997 | Hartvigsen et al. | ........... | 710/305 |
| 5,826,047 A * | 10/1998 | Dunn et al. | ........... | 710/305 |
| 5,826,058 A * | 10/1998 | Hartvigsen et al. | ........... | 703/20 |
| 6,265,894 B1 * | 7/2001 | Reblewski et al. | ........... | 326/39 |
| 6,625,684 B1 * | 9/2003 | Casey et al. | ........... | 710/316 |
| 6,625,768 B1 * | 9/2003 | Reohr et al. | ........... | 714/729 |
| 6,754,862 B1 * | 6/2004 | Hoyer et al. | ........... | 714/725 |
| 6,813,579 B1 * | 11/2004 | Meyer | ........... | 702/120 |
| 6,813,739 B1 * | 11/2004 | Grannis, III | ........... | 714/729 |
| 6,947,884 B2 * | 9/2005 | Swoboda | ........... | 703/28 |
| 7,219,265 B2 * | 5/2007 | Yee | ........... | 714/30 |
| 2003/0233601 A1 * | 12/2003 | Vaid et al. | ........... | 714/42 |

* cited by examiner

*Primary Examiner* — Ricky Ngo
*Assistant Examiner* — Paul H Masur

(57) ABSTRACT

An apparatus and method for flexible visibility in an integrated circuit are disclosed. As one example, an apparatus for flexible visibility in an integrated circuit is disclosed. The apparatus includes a switch unit disposed in the integrated circuit, the switch unit configured to receive a plurality of signals associated with a plurality of visibility points in the integrated circuit, and output the received plurality of signals in a serial form. Also, the apparatus includes a formatter unit disposed in the integrated circuit and coupled to the switch unit, the formatter unit configured to receive the plurality of signals in the serial form, and output a plurality of formatted signals including the received plurality of signals.

20 Claims, 4 Drawing Sheets

APPARATUS AND METHOD FOR FLEXIBLE VISIBILITY IN INTEGRATED CIRCUITS WITH MINIMAL PACKAGE IMPACT

FIELD OF THE INVENTION

The invention is related to the integrated circuit (IC) manufacturing test field, and particularly, but not exclusively, to an apparatus and method for flexible visibility in ICs with minimal package impact.

BACKGROUND OF THE INVENTION

In the design and manufacture of ICs, such as Application-Specific ICs (ASICs), Radio Frequency ICs (RFICs), and digital logic in general, it is advantageous to minimize the number of pins on an IC's package. Reducing the pin-out in an IC device simplifies routing in the IC, minimizes the PCB area used, and reduces the package cost of the device. However, IC designers (e.g., ASIC or RFIC designers) have to include functionality that provides visibility to the internal signals of the IC, so that these signals can be used, for example, during post-silicon verification or for debug purposes. In this regard, the more internal signals that can be made visible, the greater the test flexibility that can be provided for verification and debug of the IC. In fact, the importance of visibility has increased significantly, in view of the increased mask costs of the existing IC process nodes. For example, if a fault goes undetected during the pre-silicon verification process, and remains undetected during the first spin of the device, it is absolutely essential that the maximum visibility possible be provided to ensure that the underlying issue is readily understood and the fault is eliminated prior to the second and (hopefully) final spin. As such, a situation may be imagined where a bug is present in the first spin of a device, but not enough visibility is provided to determine the location (or cause) of the bug. Consequently, the designers of the device are faced with the unfortunate dilemma of having to perform a multi-million dollar re-spin, and not having enough data to determine and correct the problem.

A typical visibility technique currently used is to provide a combinatorial multiplexer that selects which internal signals are visible on a visibility bus. For an RFIC, a typical design requirement is to provide visibility for the In-phase and Quadrature (I/Q) components of a signal, and adequate clock and control signal visibility to enable sampling of the data involved. Consequently, the visibility bus for a typical RFIC needs to have 18 bits for the I signal component, another 18 bits for the Q signal component, one bit for the clock, one bit for synchronization, or a total of 38 bits. Unfortunately, in the wireless terminal RFIC design field, reserving 38 bits during the operation of an RFIC for potential verification or debug purposes is prohibitive, because of the existing RFIC design requirements for small PCB footprints and low package costs.

Another visibility technique currently used is to multiplex multiple signals in a time-shared fashion to the visibility pins. For example, if a designer desires visibility for 24 signals in a device, but the device only has 4 pins available, the visibility logic can be designed to output the 24 signals sequentially in 4-bit groups. Unfortunately, in this example, the output clock rate would have to be six times that of the data rate of the signals the designer wishes to observe in the device. This design would require either an unrealistically high Input/Output (I/O) rate, or the designer would lose all visibility for signals that change faster than once every six clocks. Therefore, it would be desirable to have a flexible visibility technique, which enables an IC designer to tradeoff data rates for visibility resolution in a way that maximizes visibility and minimizes pin usage (and package cost) for the device involved.

SUMMARY OF THE INVENTION

In a first example embodiment, an apparatus for flexible visibility in an integrated circuit is provided. The apparatus includes a switch unit disposed in the integrated circuit, the switch unit configured to receive a plurality of signals associated with a plurality of visibility points in the integrated circuit, and output the received plurality of signals in a serial form. Also, the apparatus includes a formatter unit disposed in the integrated circuit and coupled to the switch unit, the formatter unit configured to receive the plurality of signals in the serial form, and output a plurality of formatted signals including the received plurality of signals.

In a second example embodiment, an apparatus for flexible visibility in an integrated circuit is provided. The apparatus includes means for receiving a plurality of signals associated with a plurality of visibility points in the integrated circuit, and outputting the received plurality of signals in a serial form. Also, the apparatus includes means coupled to an output of the means for receiving, for receiving the plurality of signals in the serial form, and outputting a plurality of frames including the received plurality of signals.

In a third example embodiment, a method for providing flexible visibility in an integrated circuit is provided. The method includes the steps of receiving a plurality of signals associated with a plurality of visibility points in the integrated circuit, outputting the received plurality of signals in a serial form, receiving the plurality of signals in the serial form, and outputting at least one frame including the plurality of signals received in the serial form.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
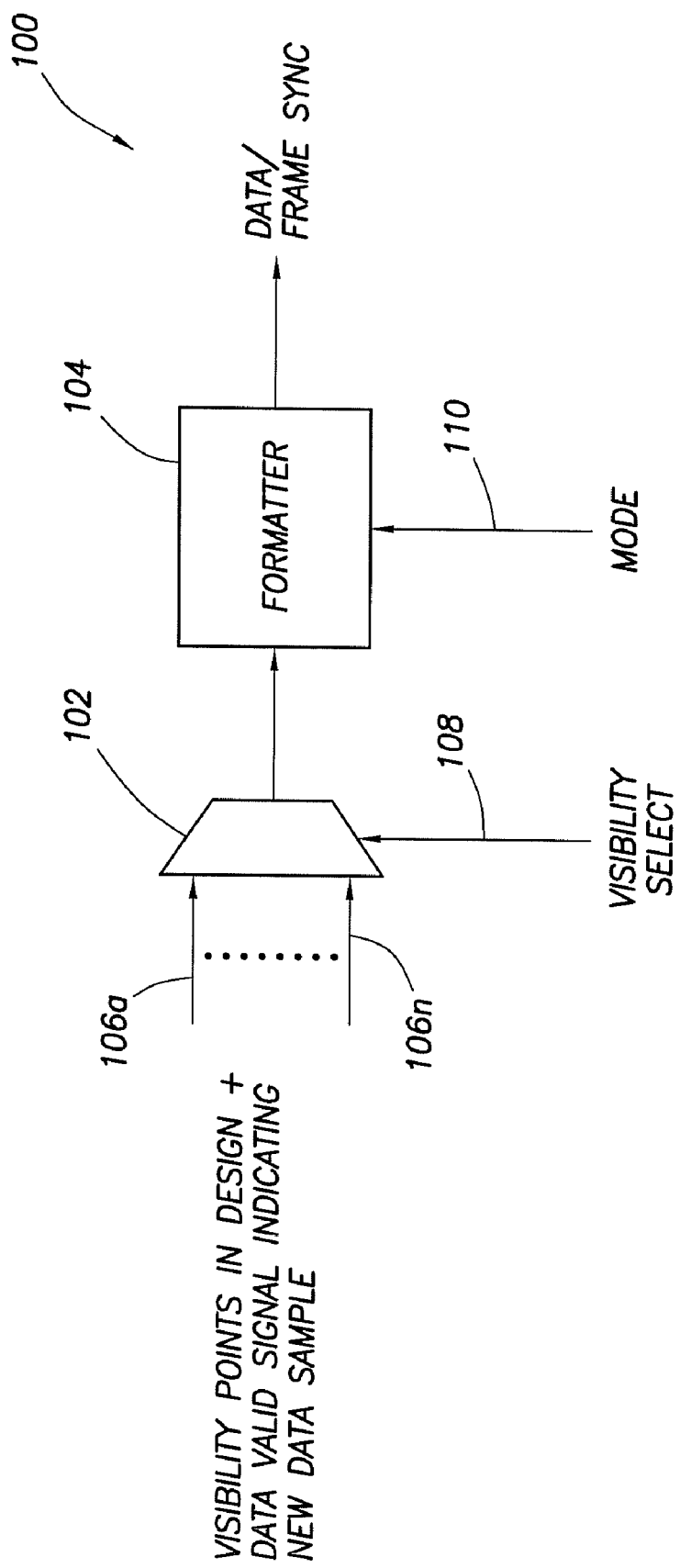
FIG. 1 depicts an apparatus for flexible visibility in an IC, which can be used to implement an example embodiment of the present invention.

With reference now to the figures, FIG. 1 depicts an apparatus 100 for flexible visibility in an IC, which can be used to implement an example embodiment of the present invention. As such, apparatus 100 can be implemented with digital logic in any suitable IC device, such as, for example, an ASIC and/or RFIC device in which visibility and package costs are appropriate design concerns. For this example embodiment, for illustrative purposes and ease of understanding, apparatus 100 is preferably implemented with suitable digital logic and/or software in a wireless terminal RFIC device including one or more functional processing blocks or sub-blocks (not shown).

For this example embodiment, apparatus 100 includes a multiplexer 102 coupled to a formatter 104. For example, multiplexer 102 and formatter 104 may be implemented in an IC device with suitable IC components. A primary function of multiplexer 102 is to receive data on each input line 106a through 106n coupled from each visibility point of interest in the IC device involved (e.g., from the one or more functional blocks or sub-blocks), and responsive to a suitable signal provided at a visibility select input line 108, select the visibility data to be conveyed to the formatter 104. For this illustrative example, "n" represents the total number of visibility points of interest in the IC device. In addition to the data present at each visibility point, the source of the data at each visibility point can also generate a "Data Valid" signal (or similar other signal) that indicates when the data has changed. For example, the internal working characteristics of a signal processing filter (e.g., functional sub-block in a receiver) may change during every clock cycle, but the data samples received from the signal processing filter may update only once every four or more clocks.

For this example embodiment, the formatter 104 receives the selected visibility data samples (and associated Data Valid signals) from the multiplexer 102, and formats the received data into one of a plurality of frame formatting schemes (of which, three exemplary schemes or modes are described in detail below). Responsive to a suitable signal provided at a mode input line 110, the formatter 104 selects the specific formatting scheme to be used. As such, each of the available formatting schemes provides various tradeoffs between the visibility resolution of the IC device and the observable clock rate. Consequently, apparatus 100 provides enough flexibility for the visibility in an IC device to view high data-rate data at low resolutions, and low data-rate data at high resolutions. Therefore, as a result, apparatus 100 provides a unique flexible visibility interface or functional capability, which can minimize pin-out impact (and package cost) for the IC device involved, and also maintain maximum flexibility of visibility into the device.

For illustrative purposes, assume that a system and packaging analysis has been performed for a prototyped IC device that includes the example embodiment of apparatus 100, and the analysis has concluded that 14 pins of the device are available for visibility purposes. Also, assume that the 14 pins are to be split into two channels of 7 pins, and each channel's set of 7 pins is to include 6 pins for data and 1 pin for a frame sync signal. Note that for such an implementation with 6 data lines, a designer needs to achieve the most flexible visibility possible. Also note that if the clock to be used by the visibility interface is not available externally (e.g., the clock signal is neither output nor a primary input), then each visibility channel would require an additional pin for the clock signal. Consequently, assuming the worst case for this example, the visibility interface would have to be capable of providing visibility for 6 data signals, 1 frame sync signal, and 1 clock signal (8 bits).

Notably, in one example embodiment, the present invention provides an apparatus 100 for flexible visibility in an IC, which enables the multiplexing of the visibility points of interest in the IC into numerous different frame formats (described in detail below). As a result, the present invention provides a highly flexible visibility interface or functional capability that can be used to directly monitor fast, low resolution signals (e.g., counters, etc.) as well as slower, high resolution signals (e.g., receiver I/Q data samples, etc.) in the IC device involved. For illustrative purposes in this example embodiment, it may be assumed that data may be passed from internal nodes to a visibility block through 16-bit wide vectors. In those cases where some of the 16 bits are not available, the upper-most bits of the 16 bits may be used.

Figure 2:
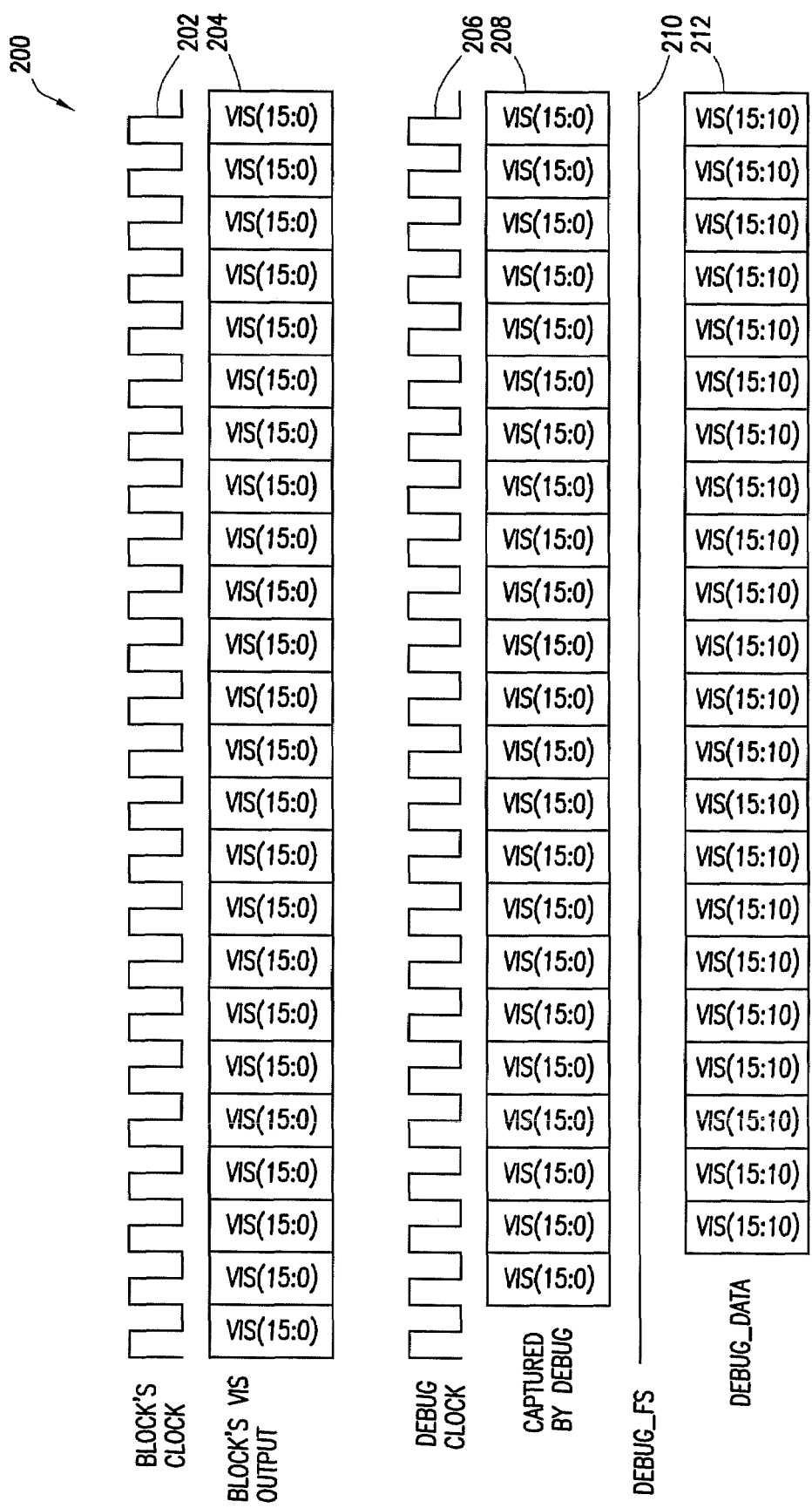
FIG. 2 is a diagram depicting pictorial representations of a plurality of signal waveforms for a first visibility mode of operation, which can be used to illustrate an example embodiment of the present invention.

FIG. 2 is a diagram depicting pictorial representations of a plurality of signal waveforms for a first visibility mode of operation 200, which can be used to illustrate an example embodiment of the present invention. For example, mode 200 may represent an exemplary operational mode for multiplexer 102 and formatter 104 shown in FIG. 1. This mode may be selected by inputting a suitable signal to formatter 104 via mode input line 110, and the visibility points of interest for a functional block or sub-block in an IC device may be selected for formatting by inputting a suitable signal to multiplexer 102 via visibility select input line 108.

For this example embodiment, FIG. 2 shows six signal waveforms indicated generally by numbers 202, 204, 206, 208, 210 and 212. Essentially, in this mode of operation, there is only one signal of interest selected for visibility, and no multiplexing of other visibility signals is perform-ed. For this illustrative example, waveform 202 represents an internal clock signal for a pertinent functional block in an IC device, and waveform 204 represents the signal samples present at the visibility output of that functional block. As such, for this example embodiment, waveforms 202 and 204 are present at input lines 106a through 106n of multiplexer 102 in FIG. 1. As indicated by waveform 202 and the text "Vis(15:0)" shown in each sample in waveform 204, during each clock cycle, for the points of interest, visibility at the block's output is being provided for bits 15 through 0, or a total of 16 bits.

Also, in FIG. 2, waveform 206 represents a debug clock signal for the functional block, and waveform 208 represents debug data samples captured for a visibility point of interest by a debug sub-function in the functional block. Thus, responsive to a suitable signal applied to the visibility select input line 108, the debug data samples for the visibility point of interest have been selected for visibility and additional processing. For this example embodiment, multiplexer 102 is conveying the debug clock signal waveform 206 and captured debug data samples waveform 208 to the input of formatter 104. As indicated by waveform 206 and the text "Vis(15:0)" in the data samples of waveform 208 at the input of formatter 104, during each clock cycle, visibility is provided for bits 15 through 0 of the captured debug data samples, or a total of 16 bits.

Additionally, in FIG. 2 for this example embodiment, waveform 210 represents a debug frame sync signal at the output of formatter 104, and waveform 212 represents the debug data samples being output by formatter 104. As indicated by waveform 210 and the text "Vis(15:10)" in the data samples of waveform 212, during each clock cycle, visibility is ultimately being provided for bits 15 through 10 of the debug data, or a total of 6 bits. As can be seen, the operation of apparatus 100 in mode 200 provides adequate visibility for data samples up to 6 bits wide at the full clock rate. Such a mode is advantageous for small internal counters or state machines, wherein it is vital to know their states from clock to clock.

Figure 3:
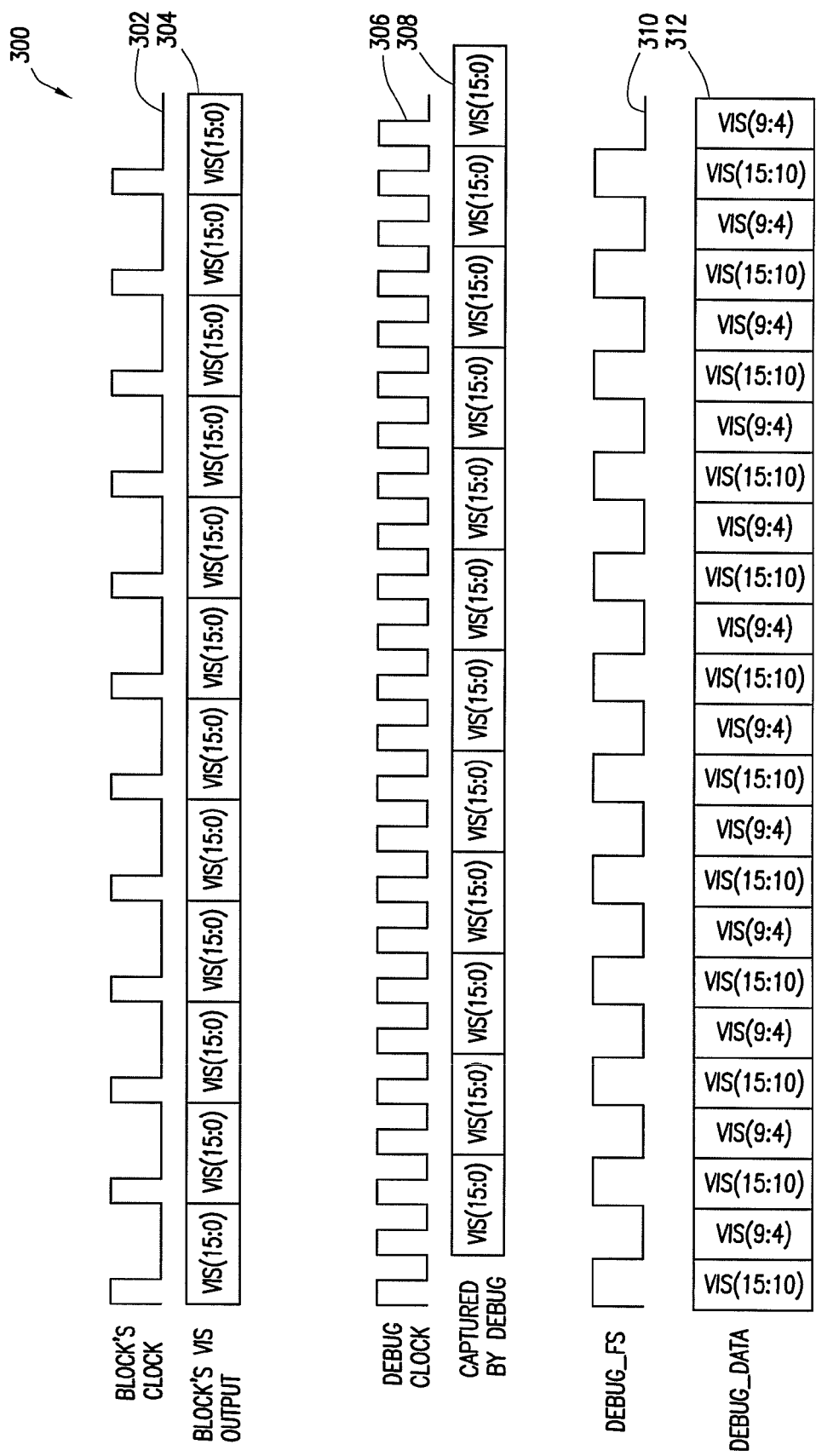
FIG. 3 is a diagram depicting pictorial representations of a plurality of signal waveforms for a second visibility mode of operation, which can be used to illustrate a second example embodiment of the present invention.

FIG. 3 is a diagram depicting pictorial representations of a plurality of signal waveforms for a second visibility mode of operation 300, which can be used to illustrate a second example embodiment of the present invention. Mode 300 may represent a second exemplary operational mode for multiplexer 102 and formatter 104 shown in FIG. 1, and this mode may be selected by inputting a suitable signal to formatter 104 via mode input line 110. Also, the visibility points of interest for a functional block or sub-block in an IC device may be selected for formatting by inputting a suitable signal to multiplexer 102 via visibility select input line 108.

For this example embodiment, FIG. 3 shows six signal waveforms indicated generally by numbers 302, 304, 306, 308, 310 and 312. Similar to mode 200, in this second mode of operation, there is only one signal of interest selected for visibility, and no multiplexing of other visibility signals is performed. For this illustrative example, waveform 302 represents an internal clock signal for a functional block in an IC device, and waveform 304 represents signal data samples present at the visibility output of that functional block. As such, for this example embodiment, waveforms 302 and 304 are present at input lines 106a through 106n of multiplexer 102 in FIG. 1. As indicated by waveform 302 and the text "Vis(15:0)" in the data samples of waveform 304, during each clock cycle, for the points of interest, visibility is being provided for bits 15 through 0, or a total of 16 bits.

Also, in FIG. 3, waveform 306 represents a debug clock signal for the functional block, and waveform 308 represents debug data samples for the point of interest captured by a debug sub-function in the functional block. Thus, responsive to a suitable signal on the visibility select input line 108, the debug data samples for the point of interest have been selected for visibility and additional processing. For this example embodiment, the debug clock signal waveform 306 and captured debug data samples waveform 308 are conveyed by multiplexer 102 to the input of formatter 104. As indicated by waveform 306 and the text "Vis(15:0)" in the data samples of waveform 308 at the input of formatter 104, visibility is provided for bits 15 through 0 of the captured debug data during 2 debug clock cycles.

Additionally, in FIG. 3 for this example embodiment, waveform 310 represents a debug frame sync signal at the output of formatter 104, and waveform 312 represents the debug data samples for the point of interest being output by formatter 104. As indicated by waveform 310 and the text "Vis(15:10)" and "Vis(9:4)" in each pair of data samples of waveform 312, up to 12 bits of each debug data sample can be observed at ½ the clock rate. In other words, the operation of apparatus 100 in mode 300 provides adequate visibility for data samples up to 12 bits wide at a much slower rate (½) than the maximum clock rate. Similar to mode 200, mode 300 is also advantageous for small internal counters or state machines, wherein it is vital to know their states from clock to clock.

Figure 4:
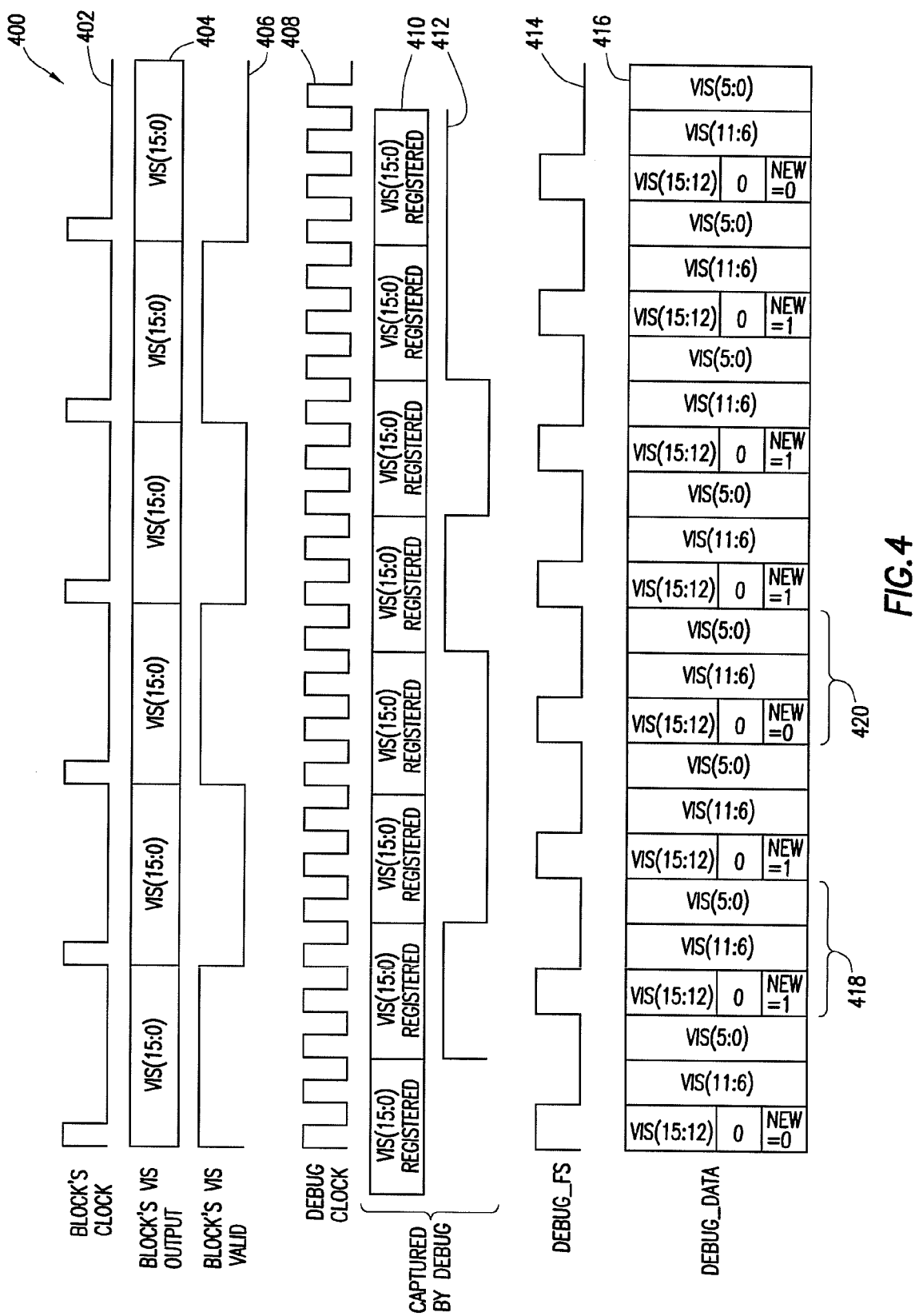
FIG. 4 is a diagram depicting pictorial representations of a plurality of signal waveforms for a third visibility mode of operation, which can be used to illustrate a third example embodiment of the present invention.

FIG. 4 is a diagram depicting pictorial representations of a plurality of signal waveforms for a third visibility mode of operation 400, which can be used to illustrate a third example embodiment of the present invention. Mode 400 may represent a third exemplary operational mode for multiplexer 102 and formatter 104 shown in FIG. 1, and this mode may be selected by inputting a suitable signal to formatter 104 via mode input line 110. Also, the visibility points of interest for a functional block or sub-block in an IC device may be selected for formatting by inputting a suitable signal to multiplexer 102 via visibility select input line 108.

For this example embodiment, FIG. 4 shows eight signal waveforms indicated generally by numbers 402, 404, 406, 408, 410, 412, 414 and 416. In this mode of operation, waveform 404 includes a plurality of different visibility signal samples of interest for a functional block in the device. Suitable signals may be input on visibility select input line 108 that cause multiplexer 102 to convey the plurality of visibility signals to the input of formatter 104. In any event, for this illustrative example, waveform 402 represents an internal clock signal for a functional block in an IC device, and waveform 404 represents 16 bit data samples present at the visibility output of that functional block. Also, waveform 406 represents a plurality of "data valid" signals also present at the visibility output of that functional block. Notably, for this example embodiment, a data valid signal is output each time a new (16 bit) data sample is received from the visibility point involved (e.g., as shown in waveform 404). As such, for this illustrative example, waveforms 402, 404 and 406 are present at input lines 106a through 106n of multiplexer 102 in FIG. 1. For this example embodiment, note that the polarity of the data valid signal in waveform 406 is changed whenever a new (16 bit) data sample in waveform 404 is received at the input of multiplexer 102.

Also, in FIG. 4, waveform 408 represents a debug clock signal for the functional block involved, and waveform 410 represents debug data samples (registered) for a plurality of visibility points of interest, which have been captured by a debug sub-function in the functional block. Also, waveform 412 represents a plurality of "data valid" signals captured by the debug sub-function. Note that the polarities of the "data valid" signals in waveform 412 are changed each time new debug data is received. Thus, responsive to a suitable signal on the visibility select input line 108, the debug data for a plurality of different points of interest can be selected for visibility and additional processing. As such, these waveforms 408, 410 and 412 are present at the output of multiplexer 102.

For this example embodiment, the debug clock signal waveform 408, and the captured debug data sample waveform 410 and "data valid" signal waveform 412 are conveyed by multiplexer 102 to the input of formatter 104. As indicated by the debug clock signal waveform 408, and the plurality of 16 bit data signal samples in waveform 410, visibility can be provided for up to 16 bits of data at any clock rate equal to or less than ⅓ of the visibility clock rate. For example, this mode's capability is extremely important in the analysis of I and Q samples in a receiver or transmitter signal processing chain.

Additionally, in FIG. 4 for this example embodiment, waveform 414 represents a debug frame synchronization signal provided at the output of formatter 104, and waveform 416 represents a plurality of debug data samples being output in a frame structure by formatter 104. As indicated by waveforms 414 and 416, in this exemplary mode of operation, apparatus 100 can achieve varied data rates by providing a "New" bit in the frame structure output by formatter 104. For example, note that in waveform 416, each time formatter 104 begins a 3-clock frame structure, formatter 104 includes a "New" bit in the first data sample of the frame. Thus, for this example embodiment, if the value of the "New" bit is equal to "1", then this bit indicates that a new 16-bit sample of debug data has been received for the visibility point involved. Such a 3-clock frame structure with new debug data is indicated by the number 418. If the value of the "New" bit is "0", this bit indicates that no new debug data has been received for that visibility point. Such a 3-clock frame structure with no new debug data is indicated by the number 420.

As can be seen, in this exemplary mode of operation, apparatus 100 enables post-processing of the multiplexed visibility data samples in a way that can support a 16 bit resolution from ⅓ the visibility clock rate down to a zero rate (e.g., DC). With this degree of flexibility, apparatus 100 can enable data at rates as fast as 1× the clock rate to be observed with low visibility resolution, and data at rates slower than 3× the clock rate to be observed with high visibility resolution. Furthermore, in accordance with important principles of the present invention, apparatus 100 can provide this degree of visibility flexibility with only 7 package pins for the IC device involved. Consequently, a designer can tradeoff the multiplexing depth of a frame with pin constraints of the IC, and still achieve both high resolution and high speed visibility for post-silicon verification and fault analysis purposes.

The description of the present invention has been presented for purposes of illustration and description, and is not intended to be exhaustive or limited to the invention in the form disclosed. Many modifications and variations will be apparent to those of ordinary skill in the art. These embodiments were chosen and described in order to best explain the principles of the invention, the practical application, and to enable others of ordinary skill in the art to understand the invention for various embodiments with various modifications as are suited to the particular use contemplated.

What is claimed is:

1. An apparatus for flexible visibility in an integrated circuit, comprising:
    a switch unit disposed in the integrated circuit, the switch unit configured to receive a plurality of signals associated with a plurality of visibility points in the integrated circuit and a select input signal, and output a selected subset of the plurality of signals in a serial form based on the select input signal, the selected subset comprising a plurality of bits of a multi-bit binary value representing a waveform; and
    a formatter unit disposed in the integrated circuit and coupled to the switch unit, the formatter unit configured to receive the selected subset of the plurality of signals in the serial form, and alternatively output multiple portions of the plurality of bits comprising the multi-bit binary value.

2. The apparatus of claim 1, wherein the formatter unit is further configured to output the plurality of formatted signals in accordance with at least one formatter mode of a plurality of formatter modes.

3. The apparatus of claim 1, wherein the formatter unit is further configured to output the plurality of formatted signals in accordance with one formatter mode of three formatter modes.

4. The apparatus of claim 1, wherein each signal of the plurality of signals associated with the plurality of visibility points includes a data sample and a data valid signal associated with the data sample.

5. The apparatus of claim 1, wherein each signal of the plurality of signals associated with the plurality of visibility points includes a data sample and a data valid signal associated with the data sample, and the data valid signal includes an indication that the data sample is either a new data sample or not a new data sample.

6. The apparatus of claim 1, wherein the plurality of formatted signals comprises a plurality of frames, and each frame of the plurality of frames includes a plurality of data samples and data indicating that the plurality of data samples either includes new data or does not include new data.

7. The apparatus of claim 1, wherein the plurality of formatted signals comprises a plurality of frames, each frame of the plurality of frames includes a plurality of data samples associated with the plurality of visibility points and a bit, and the value of the bit indicates that the plurality of data samples either includes new data or does not include new data.

8. The apparatus of claim 1, wherein the plurality of formatted signals includes a plurality of data samples and a plurality of synchronization signals.

9. The apparatus of claim 1, wherein the plurality of formatted signals comprises a plurality of frames and a plurality of frame synchronization signals.

10. The apparatus of claim 1, wherein the plurality of formatted signals comprises a plurality of frames, and each frame of the plurality of frames includes a plurality of debug data samples and at least one debug frame synchronization signal.

11. The apparatus of claim 1, wherein the switch unit is a multiplexer, and the formatter unit is a frame formatter.

12. An apparatus for flexible visibility in an integrated circuit, comprising:
    a multiplexer configured to receive a plurality of signals associated with a plurality of visibility points in the integrated circuit and a select input signal, and output a selected subset of the plurality of signals in a serial form based on the select input signal, the selected subset comprising a plurality of bits of a multi-bit binary value representing a waveform; and
    a formatter coupled to the output of the multiplexer, the formatter configured to receive the selected subset of the plurality of signals in the serial form, format the selected subset of the plurality of signals into a plurality of frames each comprising a portion of the plurality of bits, and alternatively output the plurality of frames.

13. The apparatus of claim 12, wherein the formatter is further configured to output the plurality of frames signals in accordance with one of three operating modes.

14. The apparatus of claim 12, wherein each frame of the plurality of frames further includes a plurality of data samples and data indicating that the plurality of data samples either includes new data or does not include new data.

15. The apparatus of claim 12, wherein each frame of the plurality of frames further includes a plurality of data samples and a data bit, and a value of the data bit indicates whether or not the frame includes new data.

16. The apparatus of claim 12, wherein each of the three operating modes corresponds to a particular combination of a data rate and a resolution.

17. The apparatus of claim 12, wherein each frame of the plurality of frames further includes a plurality of debug data samples and at least one debug frame synchronization signal.

18. A method for providing flexible visibility in an integrated circuit, comprising the steps of:
    receiving a plurality of signals associated with a plurality of visibility points in the integrated circuit;
    selecting a subset of the plurality of signals, the selected subset comprising a plurality of bits of a multi-bit binary value representing a waveform;
    formatting the selected subset of the plurality of signals into a plurality of frames, each frame comprising a portion of the plurality of bits; and
    alternatively outputting the plurality of frames.

19. The method of claim 18, wherein the step of formatting the selected subset of the plurality of signals into frames comprises:
    selecting one of a plurality of operating modes, each operating mode corresponding to a combination of a data rate and a resolution.

20. The method of claim 18, wherein the at least one frame includes a data bit, and a value of the data bit indicates whether or not the at least one frame includes a new data sample.

* * * * *